(12) United States Patent
Masuichi et al.

(10) Patent No.: US 7,604,864 B2
(45) Date of Patent: Oct. 20, 2009

(54) SUBSTRATE FOR ORGANIC EL AND METHOD FOR MANUFACTURING THE SAME

(75) Inventors: Mikio Masuichi, Kyoto (JP); Yoshihiro Fujimoto, Kyoto (JP)

(73) Assignee: Dainippon Screen Mfg. Co., Ltd. (JP)

(*) Notice: Subject to any disclaimer, the term of this patent is extended or adjusted under 35 U.S.C. 154(b) by 430 days.

(21) Appl. No.: 11/340,964

(22) Filed: Jan. 26, 2006

(65) Prior Publication Data
US 2006/0170338 A1    Aug. 3, 2006

(30) Foreign Application Priority Data
Feb. 2, 2005    (JP)    ............... 2005-026209

(51) Int. Cl.
*G02B 5/20*    (2006.01)
(52) U.S. Cl. ........................... 428/421; 313/504
(58) Field of Classification Search ............ None
See application file for complete search history.

(56) References Cited

U.S. PATENT DOCUMENTS

| | | | | |
|---|---|---|---|---|
| 7,102,280 | B1* | 9/2006 | Duineveld et al. | 313/504 |
| 7,109,653 | B2* | 9/2006 | Imamura | 313/512 |
| 7,282,843 | B2* | 10/2007 | Kiguchi et al. | 313/112 |
| 7,378,790 | B2* | 5/2008 | Aruga et al. | 313/500 |
| 2003/0060038 | A1* | 3/2003 | Sirringhaus et al. | 438/637 |
| 2004/0201048 | A1* | 10/2004 | Seki et al. | 257/294 |
| 2005/0170076 | A1 | 8/2005 | Seki et al. | |
| 2005/0170550 | A1 | 8/2005 | Seki et al. | |
| 2005/0186403 | A1 | 8/2005 | Seki et al. | |
| 2006/0065897 | A1 | 3/2006 | Hirai et al. | |

FOREIGN PATENT DOCUMENTS

| | | |
|---|---|---|
| JP | 10-197715 | 7/1998 |
| JP | 2000-35511 | 2/2000 |
| JP | 2002-62422 | 2/2002 |
| JP | 2002-372921 | 12/2002 |
| JP | 2003-300939 | 10/2003 |
| JP | 2004-55159 | 2/2004 |
| KR | 2006-0051228 | 5/2006 |
| WO | WO99/48339 | * 9/1999 |

* cited by examiner

*Primary Examiner*—Ashok Patel
(74) *Attorney, Agent, or Firm*—Ostrolenk Faber LLP

(57) ABSTRACT

A non-oil repellent photosensitive material layer 2 and an oil repellent photosensitive material layer 3 formed by coating on a substrate 1 are exposed at the same time with light having a single wavelength (I-line) in accordance with bank regions and thereafter developed. In consequence, banks 300 are formed having a double-layer structure which is comprised of bottom layer portions 31 of a non-oil repellent material and top layer portions 32 of an oil repellent material. This blocks organic EL materials supplied between the banks 300 from moving beyond tops of the banks 300 and prevents color mixing of the organic EL materials. Further, since the bottom layer portions 31 between which organic layers are formed are made of the non-oil repellent material, the profiles of the organic layers will not change due to surface tension.

5 Claims, 4 Drawing Sheets

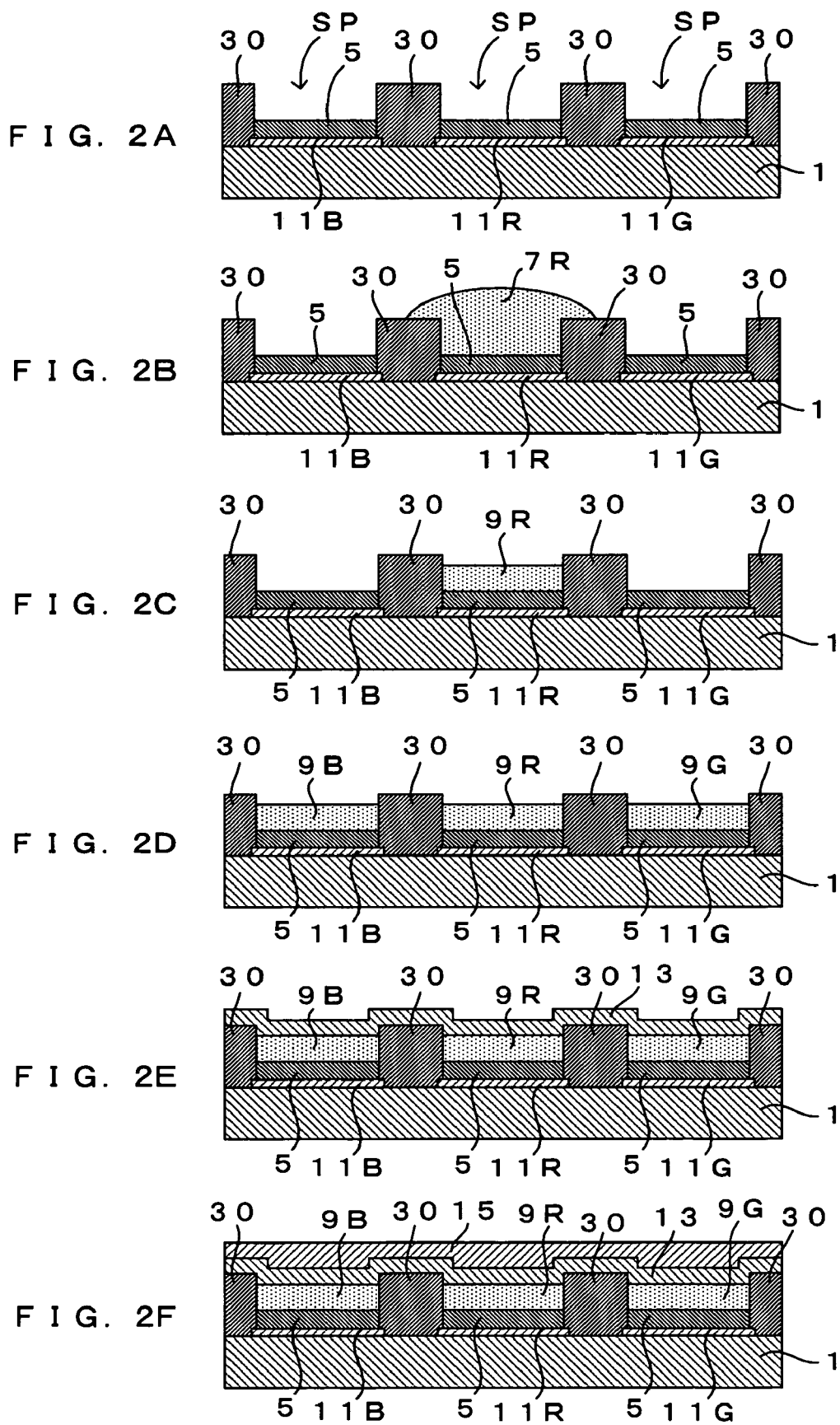

SUBSTRATE FOR ORGANIC EL AND METHOD FOR MANUFACTURING THE SAME

CROSS REFERENCE TO RELATED APPLICATION

The disclosure of Japanese Patent Application No. 2005-026209 filed Feb. 2, 2005 including specification, drawings and claims is incorporated herein by reference in its entirety.

BACKGROUND OF THE INVENTION

1. Field of the Invention

The present invention relates to a substrate for organic EL which is used for forming organic layers, such as hole transportation layers and organic EL (electro-luminescence) layers, in predetermined pattern shapes, and to a method of manufacturing such a substrate.

2. Description of the Relates Art

A conventional organic EL element is manufactured in the following manner. First, a transparent ITO (indium tin oxide) film is deposited on a surface of a transparent substrate which may be a glass substrate. Next, the ITO film deposited on this substrate is patterned into first electrodes which are shaped like plural stripes, utilizing a photolithographic technique. The first electrodes correspond to anodes. Following this, electrical insulation banks (barrier walls) protruding beyond the substrate are formed surrounding the stripe-shaped first electrodes.

For patterning of organic layers such as hole transportation layers and organic EL layers on the substrate into desired pattern shapes, coating liquids containing materials for formation of the organic layers such as hole transportation layers and organic EL layers are applied upon the substrate as described below. According to the method of manufacturing an organic EL element described in Japanese Unexamined Patent Application Publication No. 2004-55159 for example, after pouring a hole transportation material onto first electrodes surrounded by banks and accordingly forming hole transportation layers, plasma treatment is performed upon tops of the banks with $CF_4$ gas and the tops of the banks are fluorinated (liquid repellent treatment). Organic EL materials of red, green and blue are then put in this order each on each first electrode corresponding to each color through the hole transportation layers. Since the tops of the banks are liquid repellent, the organic EL material of each color is blocked from moving beyond the tops of the banks.

Next, by vacuum deposition, second stripe-shaped electrodes to be opposed against the first electrodes orthogonally are formed parallel to each other on the substrate, thereby sandwiching the organic EL materials between the first electrodes and the second electrodes. The second electrodes correspond to cathodes. In this manner, organic EL elements are fabricated in which the first electrodes and the second electrodes are arranged in a simple XY matrix and which are capable of displaying in full colors.

According to the conventional technique, the range of applying the hole transportation material is limited to between the banks and the plasma treatment is performed upon tops of the banks to make the tops liquid repellent, and therefore, it is possible to block the organic EL material of each color applied between the banks from moving over to other inter-bank areas and effectively prevent color mixing of the organic EL materials.

SUMMARY OF THE INVENTION

By the way, while the sizes of substrates are becoming larger for efficient manufacturing, an attempt to perform plasma treatment of a large-size substrate gives rise to the following problem. That is, a vacuum chamber is indispensable to plasma treatment which aims at making banks liquid repellent. Although the volume of the chamber can be reduced in accordance with the size of a small substrate, the larger the substrate size becomes, the larger the chamber volume becomes. Hence, it is difficult to develop plasma inside the vacuum chamber, due to which plasma treatment inside the vacuum chamber becomes impractical in terms of both the size and the tact of the plasma treatment. However, there has not been any effective means of making banks formed on a large substrate liquid repellent and preventing color mixing of organic EL materials.

The present invention has been made in light of the problems above. Accordingly, the object of the present invention is to provide a substrate for organic EL which prevents color mixing of organic EL materials between adjacent banks even on a large-size substrate while the organic EL materials are being supplied between the banks formed on the substrate, and to provide a method of manufacturing such a substrate.

According a first aspect of the present invention, there is provided a substrate for organic EL, comprising: a pattern which is formed on a surface of the substrate; and a bank which is formed on the surface of the substrate in accordance with the pattern, wherein a top surface of the bank is made of a liquid repellent photosensitive material.

According to a second aspect of the present invention, there is provided a method of manufacturing a substrate for organic EL comprising: a coating step of applying a liquid repellent photosensitive material upon a substrate and forming a liquid repellent photosensitive material layer; and a step of exposing the liquid repellent photosensitive material layer on the substrate in accordance with a predetermined pattern, then developing and forming a bank corresponding to the pattern.

According to a third aspect of the present invention, there is provided a method of manufacturing a substrate for organic EL comprising: a first coating step of applying a non-liquid repellent photosensitive material upon a substrate and forming a non-liquid repellent photosensitive material layer; a second coating step of applying a liquid repellent photosensitive material upon the non-liquid repellent photosensitive material layer and forming a liquid repellent photosensitive material layer; and a step of exposing the non-liquid repellent photosensitive material layer and the liquid repellent photosensitive material layer on the substrate in accordance with a predetermined pattern at the same time, then developing and forming a bank corresponding to the pattern.

In the context of the invention, the liquid repellency means both oil repellency and water repellency against a coating liquid which contains a material (organic layer forming material) for forming an organic layer such as an organic EL material and a hole transportation material. In short, the liquid repellency means oil repellency in the event that a coating liquid (solution) supplied between banks is oil-based, i.e., a solution (which is mainly a solvent) whose principal ingredient is oil but means water repellency in the event that a coating liquid is water-based, i.e., a solution (which is mainly a solvent) whose principal ingredient is water.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIGS. 2A through 2F are drawings which show an embodiment of a method of manufacturing organic EL elements;

DETAILED DESCRIPTION OF THE PREFERRED EMBODIMENT

First Embodiment

Figure 1A:
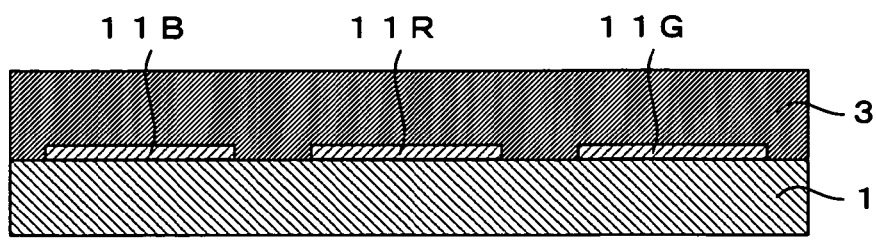
FIGS. 1A through 1C are drawings which show a first embodiment of a method of manufacturing a substrate for organic EL of the invention.
Figure 1B:
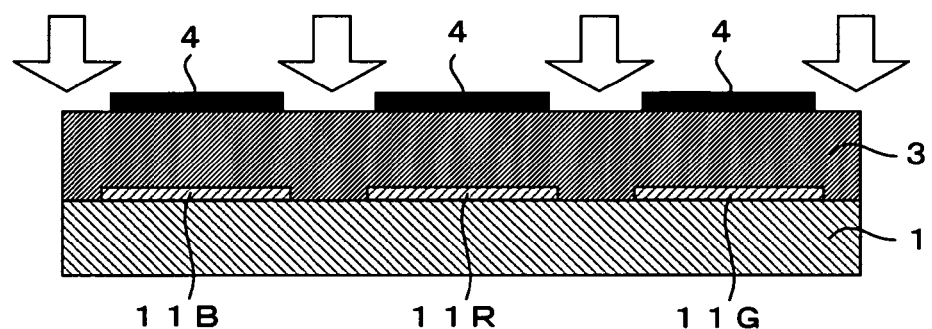
Figure 1C:
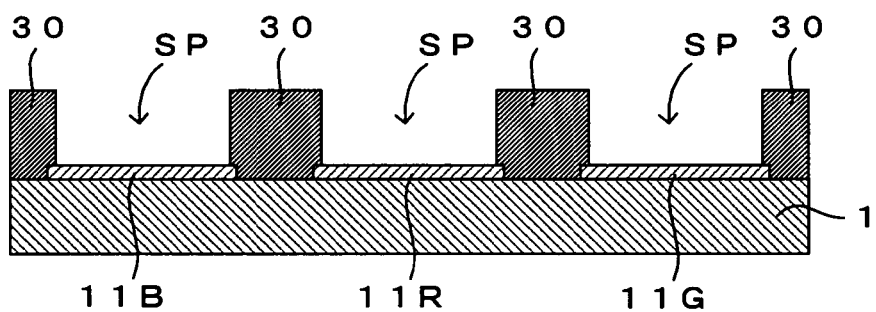

FIGS. 1A through 1C are drawings which show a first embodiment of a method of manufacturing a substrate for organic EL of the invention. In this embodiment, first, by a coating method such as spin coating, an oil repellent photosensitive material which will become a bank (barrier wall) material which will be described later is applied upon a substrate 1 which first electrodes 11R, 11G and 11B are formed by patterning on the surface as shown in FIG. 1A (coating step). This forms an oil repellent photosensitive material layer 3 on the substrate 1. The first electrodes 11R, 11G and 11B are obtained by patterning an ITO (indium tin oxide) film into plural stripes for instance, and correspond to anodes. To secure emission of light (luminescence from organic EL layers which will be described later) from the back surface (bottom surface) side of the substrate, a glass substrate, a transparent plastic substrate or the like is used as the substrate 1, and the first electrodes 11R, 11G and 11B are preferably transparent electrodes of a composite oxide film of a tin oxide film, indium oxide and zinc oxide, etc., instead of the ITO film described above.

The oil repellent photosensitive material may be obtained by containing an oil repellent compound in photosensitive polyimide, an acrylic resin or an epoxy resin. The oil repellent compound is preferably a fluorochemical surfactant or a fluorine-contained resin whose molecule has a perfluoroalkyl group or a polyfluoroalkyl group. The examples of the oil repellent compound are listed below.

Fluorine-Contained Resin:

| Modiver | F-110 |
| | F-210 |
| | (NOF CORPORATION) |
| Fluorad | FC-725 |
| | (Sumitomo 3M Co., Ltd.) |

Fluorochemical Surfactant:

| Fluorad | FC-430 |
| | FC-171 |
| | FC-170C |
| | (Sumitomo 3M Co., Ltd.) |

| Eftop | EF-122B |
| | EF-802 |
| | (Mitsubishi Metal Corporation) |

The oil repellent photosensitive material layer 3 is then exposed in accordance with the shapes of the banks and developed. To be more specific, in accordance with the patterns of the respective first electrodes (11R, 11G and 11B) described above, the banks 30 are formed filling up the spaces between the first electrodes 11R, 11G and 11B (bank forming step). This prevents color mixing of organic EL materials formed in the manner described later, leakage of light from between pixels, etc. In the event that the oil repellent photosensitive material layer 3 is a photo-curing material (negative), light is transmitted by the bank regions and masks 4 block light over regions to be removed as shown in FIG. 1B. On the contrary, where the oil repellent photosensitive material layer 3 is a material (positive) which is altered by light to be removable, the masks 4 block light over the bank regions and the regions to be removed transmit light.

Upon exposure, leaving only the bank regions of the oil repellent photosensitive material layer 3, the other regions are developed with a solvent or the like and removed as they are dissolved as shown in FIG. 1C. In consequence, the banks 30 exhibiting oil repellency are formed into predetermined patterns, i.e., patterned on the substrate 1 as if to fill up the spaces between the respective first electrodes (11R, 11G and 11B). It is now possible to supply a coating liquid, which contains an organic layer forming material such as a hole transportation material and an organic EL material, selectively into each element space SP which is defined between the banks 30.

A method of manufacturing an organic EL element using thus fabricated substrate for organic EL will now be described. FIGS. 2A through 2F are drawings which show an embodiment of a method of manufacturing organic EL elements. First, a hole transportation material is supplied selectively between the banks, that is, into each element space SP, thereby forming hole transportation layers 5 over the first electrodes (11R, 11G and 11B) inside the respective element spaces SP. Describing in more details, a hole transportation material is prepared in advance in which an organic compound such as PEDOT (polyethylene dioxythiophene)-PSS (poly-styrene sulphonate) for formation of the hole transportation layers 5 is dissolved in a solvent. After selectively supplying the hole transportation material to the respective element spaces SP by a nozzle scan method, the substrate 1 is heated, the hole transportation material is accordingly dried, and the hole transportation layers 5 are formed (FIG. 2A).

Next, a red organic EL material (EL polymer) 7R is supplied between those banks which correspond to the first electrodes 11R by a nozzle scan method, thereby forming organic EL layers 9R on the first electrodes 11R through the hole transportation layers 5. To be more specific, the organic EL material 7R is supplied between the banks 30 which correspond to the first electrodes 11R until the organic EL material 7R has flown onto these banks and humps have been formed on the tops of the banks as shown in FIG. 2B. The solute contained in the organic EL material (solution) is less than approximately 1 wt %. In short, the remaining solvent is baked and removed from the solution. To form the organic layer that consists of the solute into a predetermined film thickness between the banks (within the respective element spaces SP), the organic EL material is made flow onto and build up on the tops of the banks 30 and the amount of coating is increased. An apparatus for supplying the organic EL material 7R may be the coater apparatus described in Japanese Unexamined Patent Application Publication No. 2002-75640 for example.

At this stage, since the banks 30 themselves are made of the oil repellent material, the tops of the banks 30 are oil repellent, and therefore, the organic EL material 7R will not flow over the banks 30 and into between the neighboring banks but stay as overflows in top surfaces of the banks 30. As the supply of the organic EL material 7R completes, a baking apparatus or the like heats the substrate 1, whereby the organic EL material 7R is dried (the solvent contained in the organic EL material is removed) and the organic EL layers 9R are formed (FIG. 2C).

Green organic EL layers 9G are then formed on the first electrodes 11G via the hole transportation layers 5, and further, blue organic EL layers 9B are then formed on the first electrodes 11B via the hole transportation layers 5 (FIG. 2D). The steps of forming these are identical to the step for the red color and therefore will not be described in redundancy. The organic EL layers of one color may be formed at one time, or alternatively, the organic EL materials 7R, 7G and 7B may be supplied at the same time and dried.

As the organic EL layers 9R, 9G and 9B are formed in this manner for the three colors, plural stripe-shaped second electrodes 13 are formed parallel to each other on the substrate 1 by vacuum deposition or the like such that the second electrodes 13 are orthogonal to and opposed against the first electrodes 11R, 11G and 11B as shown in FIG. 2E. As a result, the organic EL layers 9R, 9G and 9B are held between the first electrodes 11R, 11G and 11B which function as anodes and the second electrodes 13 which function as cathodes. This also realizes fabrication of an organic EL display apparatus in which the first electrodes 11R, 11G and 11B and the second electrodes 13 are arranged in a simple XY matrix and which is capable of displaying in full colors. In this embodiment, a sealing layer 15, which is made of a sealing material such as an epoxy resin, an acrylic resin or liquid glass, is stacked on the substrate 1 for prevention of deterioration, damaging and the like of the respective organic EL elements (FIG. 2F).

As described above, in this embodiment, since the banks 30 themselves are made of the oil repellent material, even though the organic EL materials 7R, 7G and 7B try to move beyond the tops of the banks 30, the tops of the banks 30 which are oil repellent prevent the movements of the respective organic EL materials over to the spaces between other banks and effectively obviate color mixing of the organic EL materials 7R, 7G and 7B. Further, since the banks 30 themselves are made of the oil repellent material, it is not necessary to treat the top surfaces of the banks 30 with plasma (oil repellent treatment). Hence, there is no restraint over the substrate size which a conventional apparatus will encounter for plasma treatment, and it is possible to securely prevent color mixing of the organic EL materials 7R, 7G and 7B even on the large substrate.

In addition, since the banks 30 are made of the photosensitive material in addition to its capability of repelling oil, it is not necessary to newly coat the banks with a resist or the like (an etching mask) and pattern the banks. That is, as the oil repellent material is applied upon the substrate 1, the photosensitive material itself is then exposed directly and developed, the banks exhibiting oil repellency are formed into the desired patterns which match the bank regions.

Further, since the tops at least of the banks 30 are oil repellent, the following effect is obtained. In short, one approach for prevention of color mixing of the organic EL materials may be to form the banks 30 high such that the volume of the spaces between the banks 30, namely, the element spaces SP will exceed the amount of the organic EL materials 7R, 7G and 7B supplied into these spaces, which will prevent the organic EL materials 7R, 7G and 7B from flowing over from the element spaces SP. However, merely high banks 30 leads to a problem that the organic EL elements become large, a problem that steps between the tops of the banks 30 and the organic EL layers 9R, 9G and 9B become high, the second electrodes 13 easily get disconnected over the steps and the product quality deteriorates, etc. On the contrary, in this embodiment, since the tops of the banks 30 are oil repellent, the organic EL materials 7R, 7G and 7B build up like overflows on the tops of the banks 30, which increases the tolerance for coating of the organic EL materials. In other words, even though the height of the banks 30 is relatively low, it is possible to apply the necessary amount of the organic EL materials which is needed to form the organic EL layers, and therefore, to manufacture the organic EL elements which are small and have an excellent quality.

Second Embodiment

FIGS. 3A through 3D are drawings which show a second embodiment of the method of manufacturing a substrate for organic EL of the invention. A major difference of the second embodiment from the first embodiment is that the banks have a double-layer structure, that is, top layer parts of the banks are made of an oil repellent photosensitive material and bottom layer parts of the banks are made of a non-liquid repellent photosensitive material. The second embodiment is otherwise similar in structure and operation to the first embodiment. The difference will therefore be mainly described below.

Figure 3A:
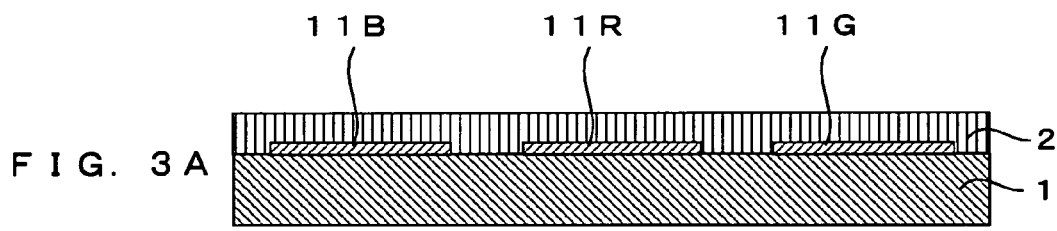
FIGS. 3A through 3D are drawings which show a second embodiment of the method of manufacturing a substrate for organic EL of the invention.

First, as shown in FIG. 3A, the substrate 1 which the first electrodes 11R, 11G and 11B are patterned on the surface is coated with a non-oil repellent photosensitive material (first coating step). In consequence, a non-oil repellent photosensitive material layer 2 which will become bottom layer films is formed on the substrate 1. The non-oil repellent photosensitive material may be photosensitive polyimide or other conventional bank material (patterning material) such as an acrylic resin and an epoxy resin.

Figure 3B:
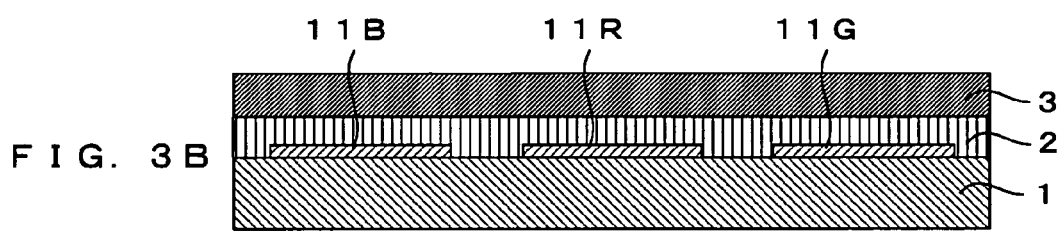

An oil repellent photosensitive material similar to the one described above is then applied upon the non-oil repellent photosensitive material layer (photosensitive polyimide layer) 2, thereby forming an oil repellent photosensitive material layer 3 which will become top layer films (second coating step; FIG. 3B). The non-oil repellent photosensitive material and the oil repellent photosensitive material are applied by a coating method such as spin coating and controlled such that predetermined film thicknesses will be attained. For instance, they are applied so that the height (film thickness) of the non-oil repellent photosensitive material layer 2 and that of the oil repellent photosensitive material layer 3 as they are dry will be each 1 μm.

Figure 3C:
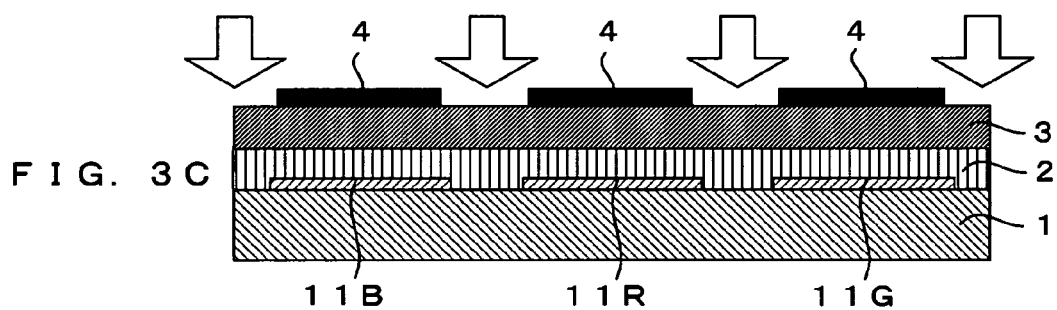

The non-oil repellent photosensitive material layer 2 and the oil repellent photosensitive material layer 3 are then exposed in accordance with the bank shapes and developed (bank forming step). Describing in more details, as shown in FIG. 3C, after blocking light with the masks 4 in accordance with the bank regions, the non-oil repellent photosensitive material layer 2 and the oil repellent photosensitive material layer 3 are exposed at the same time with light having a single wavelength. Where photosensitive polyimide is used as the non-oil repellent material, the wavelength region exhibiting exposure sensitivity is either G-line (436 nm), H-line (405 nm) or I-line (365 nm). I-line is recommended in particular, and the exposure sensitivity during exposure at I-line is 150 J/cm². Meanwhile, the oil repellent photosensitive material used in this invention exhibits exposure sensitivity at an exposure wavelength of I-line, which is common to photosensitive polyimide. Hence, irradiation of I-line exposes the oil repellent photosensitive material layer 3 serving as the top layer films and the non-oil repellent photosensitive material layer (photosensitive polyimide layer) 2 serving as the bottom layer films at the same time.

Figure 3D:
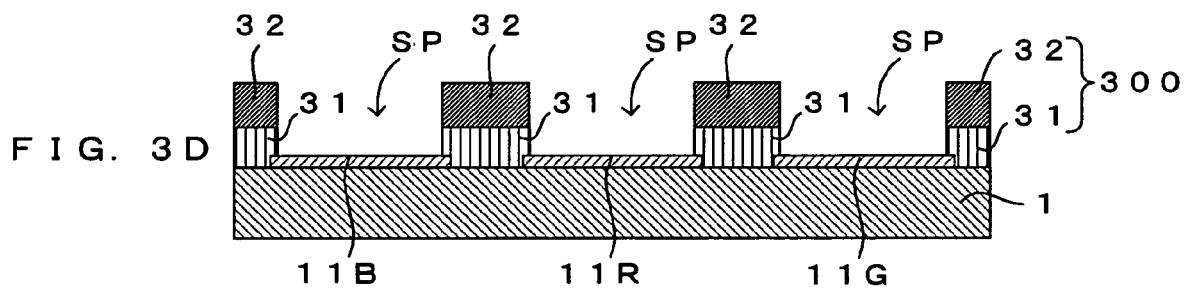

As exposure completes in this fashion, as shown in FIG. 3D, leaving the bank regions, the other regions of the non-oil repellent photosensitive material layer 2 and the oil repellent photosensitive material layer 3 are developed with a solvent or the like and removed as they are dissolved. In consequence, banks 300 having a double-layer structure that bank bottom layer portions 31 are made of the non-oil repellent material and bank top layer portions 32 are made of the oil repellent material are formed into predetermined patterns on the substrate 1,. i.e., patterned filling up the spaces between the respective first electrodes (11R, 11G and 11B). It is now possible to supply a coating liquid, which contains an organic layer forming material such as a hole transportation material and an organic EL material, selectively into each element space SP which is defined between the banks 300 comprised of the bank bottom layer portions 31 and the bank top layer portions 32.

Following this, as in the first embodiment, the coating liquids containing organic layer forming materials such as a hole transportation material and organic EL materials are introduced one after another into each element space SP, thereby forming hole transportation layers and organic EL layers. The second electrodes 13 are then vapor-deposited on these such that the second electrodes 13 are orthogonal to and opposed against the first electrodes 11R, 11G and 11B. This embodiment attains the following effect since the bank bottom layer portions 31 are made of the non-oil repellent material and the bank top layer portions 32 are made of the oil repellent material.

Figure 4A:
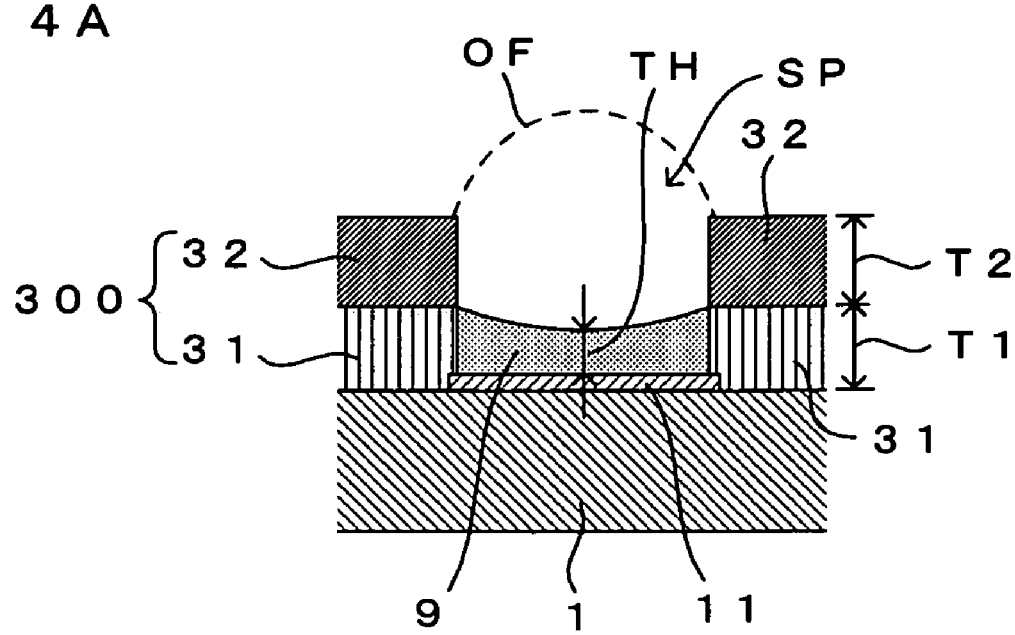
FIGS. 4A and 4B are drawings which show the profiles of organic layers formed between banks.
Figure 4B:
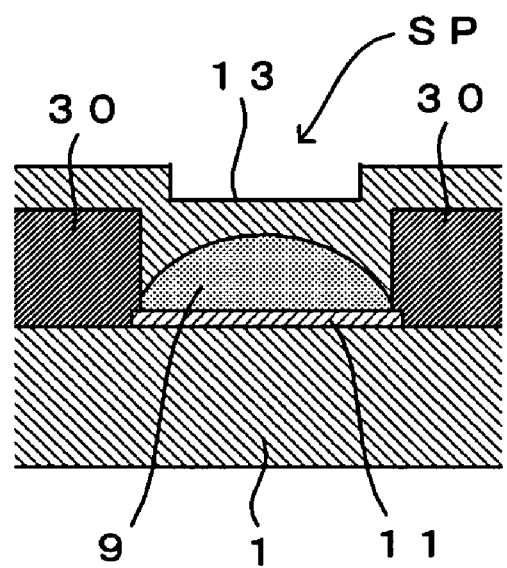

FIGS. 4A and 4B are drawings which show the profile of an organic layer formed between banks. To form the organic layer 9 such as an organic EL layer into a predetermined film thickness between banks (within each element space SP), a coating liquid, which contains an organic layer forming material such as an organic EL material, needs be supplied between the banks until the coating liquid surges onto the tops of the banks 300 and builds up as an overflow OF, and the amount of coating needs be increased. Since the bank top layer portions 32 are made of the oil repellent material, the organic EL material remains in the top surfaces of the banks and will not intrude into the neighboring element spaces SP, which prevents color mixing of the organic EL materials.

On the contrary, if not only the top surfaces of the banks but entire side surfaces of the banks as well are oil repellent as shown in FIG. 4B, the profile of the organic layer 9 provided between the banks will change into a hill-like profile (convex profile) due to surface tension. However, when the profile is shaped like a hill, the organic layer 9 contacts the side surfaces of the banks 30 only in small areas, which could result in short-circuit between the first electrode 11 and the second electrode 13 when insufficient exposure or the like occurred. In the event of such short-circuit, the organic layer 9 formed in this element space SP will not function as a luminescent layer any more, which is a fatal defect.

Noting this, this embodiment requires that the bank bottom layer portions 31 between which the organic layer 9 is formed are made of the non-oil repellent material as shown in FIG. 4A, expanding the size of the area of contact with the organic layer 9 and securing a concave profile of the organic layer 9. That is, the surface energy of the organic layer 9 contacting the bank bottom layer portions 31 increases, and a meniscus is formed in which the organic layer 9 follows the side surfaces of the banks (bank bottom layer portions 31). This secures the film thickness of the organic layer 9 between the first electrode 11 and the second electrode 13 and prevents short-circuit between these electrodes.

Further, the meniscus of the organic layer 9 along the side surfaces of the bank bottom layer portions 31 improves the controllability of the film thickness TH and ensures that the film thickness TH of the organic layer 9 formed between the bank bottom layer portions 31 remains within a certain range (from 60 nm to 80 nm for example). In consequence, the organic layer 9 (luminescent layer) provides a desired luminescent intensity.

Further, control of the thickness of each layer forming the banks 300 which have the double-layer structure achieves the following effect. That is, while the controlled thickness T1 of the bank bottom layer portions 31 of the non-oil repellent material makes it possible to control the profile and the film thickness TH of the organic layer 9, the controlled thickness T2 of the bank top layer portions 32 of the oil repellent material makes it possible to control the amount of coating property so that the coating liquid containing the organic layer forming material will remain in the top surfaces of the banks 300 and build up as overflows while the coating liquid is being supplied to the element spaces SP.

Hence, at the stage of applying the non-oil repellent photosensitive material and the oil repellent photosensitive material by spin coating and forming the non-oil repellent photosensitive material layer 2 and the oil repellent photosensitive material layer 3 respectively, the film thickness or the like of each one of the photosensitive material layers 2 and 3 may be adjusted appropriately by tuning a coating condition and the liquid composition of each coating material (photosensitive material) or the like, to thereby form the organic layer 9 having a desired profile and a desired film thickness TH in the element spaces SP.

As described above, this embodiment achieves similar effects to those promised by the first embodiment since the bank top layer portions 32 are made the oil repellent material. In short, it is possible to block the organic EL materials from moving beyond the tops of the banks 30 and effectively prevent color mixing of the organic EL materials. Further, since the bank top layer portions 32 including the top surfaces of the banks are oil repellent, it is not necessary to treat the top surfaces of the banks with plasma (oil repellent treatment) in advance. Hence, there is no restraint over the substrate size which a conventional apparatus will encounter for plasma treatment, and it is possible to securely prevent color mixing of the organic EL materials even on the large substrate 1.

In addition, since the bank bottom layer portions 31 between which the organic layer 9 is formed are of the non-oil repellent material, the profile of the organic layer will not change due to surface tension into a hill-like profile which will occurs if the organic layer is formed between oil repellent banks. In other words, since the bank top layer portions 32 alone are liquid repellent and the bank bottom layer portions 31 are not liquid repellent, the profile of the organic layer 9 is normalized into a concave profile. This prevents short-circuit between the first electrode 11 and the second electrode 13 which are on the both sides of the organic layer 9 and improves the controllability of the film thickness of the organic layer 9.

Further, in this embodiment, since the non-oil repellent photosensitive material layer 2 which is formed as the first layer on the substrate 1 and the oil repellent photosensitive material layer 3 which is formed as the second layer are both sensitive to the single exposure wavelength (I-line), it is possible to form the banks by exposing and developing the first layer and the second layer at the same time, and hence, simplify the manufacturing process than where each layer is exposed and developed.

The present invention is not limited to the embodiments above, but may be modified in various manners in addition to the preferred embodiments above, to the extent not deviating from the object of the invention. For instance, although the entire banks 30 and the bank top layer portions 32 are of an oil repellent material in the substrates for organic EL according to the embodiment above, this is not limiting. They may be made of a water repellent material in the event that a coating liquid (solution) containing an organic layer forming material to be supplied to each element space SP is an aqueous solution.

Further, the embodiments above use a spin coating method for forming the liquid repellent (oil repellent) photosensitive material layer 3 and the non-liquid repellent photosensitive material layer 2 on the substrate 1, this is not limiting. Other method may be used instead such as screen printing, spray coating, roll coating and dip coating.

Although the embodiments above require forming the organic layers such as the hole transportation layers and the organic EL layers on the first electrodes (ITO) 11R, 11G and 11B of the organic EL elements as described above, applications of the invention are not limited to this. The invention is generally applicable to a substrate for organic EL and a method of manufacturing the same which enable forming organic layers in predetermined pattern shapes on a predetermined base material.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate for organic EL, comprising:
a pattern which is formed on a surface of said substrate;
a bank which is formed on said surface of said substrate in accordance with said pattern;
wherein a top surface of said bank is made of a liquid repellent photosensitive material which is made of a photosensitive material containing a liquid repellent compound; and
wherein said liquid repellent compound is a fluorochemical surfactant or a fluorine-containing resin, the molecule in said surfactant or resin having a perfluoroalkyl group or a polyfluoroalkyl group.

2. A substrate for organic EL, comprising:
a pattern which is formed on a surface of said substrate;
a bank which is formed on said surface of said substrate in accordance with said pattern;
wherein a top surface of said bank is made of a liquid repellent photosensitive material which is made of a photosensitive material containing a liquid repellent compound;
wherein said bank as a whole is made of said liquid repellent photosensitive material; and
wherein said liquid repellent compound is a fluorochemical surfactant or a fluorine-containing resin, the molecule in said surfactant or resin having a perfluoroalkyl group or a polyfluoroalkyl group.

3. A substrate for organic EL, comprising:
a pattern which is formed on a surface of said substrate;
a bank which is formed on said surface of said substrate in accordance with said pattern;
wherein a top surface of said bank is made of a liquid repellent photosensitive material which is made of a photosensitive material containing a liquid repellent compound;
wherein said bank has a double-layer structure that a top layer portion including said top surface of said bank is made of said liquid repellent photosensitive material, whereas a bottom layer portion of said bank is made of a non-liquid repellent photosensitive material; and
wherein said liquid repellent compound is a fluorochemical surfactant or a fluorine-containing resin, the molecule in said surfactant or resin having a perfluoroalkyl group or a polyfluoroalkyl group.

4. The substrate for organic EL of claim 3 in which said bank is formed in accordance with said pattern using light having a predetermined exposure wavelength,
wherein said liquid repellent photosensitive material and said non-liquid repellent photosensitive material are both sensitive to said exposure wavelength.

5. The substrate for organic EL of claim 4, wherein said liquid repellent compound is a fluorochemical surfactant or a fluorine-containing resin, the molecule in said surfactant or resin having a perfluoroalkyl group or a polyfluoroalkyl group.

* * * * *

UNITED STATES PATENT AND TRADEMARK OFFICE
CERTIFICATE OF CORRECTION

PATENT NO. : 7,604,864 B2 Page 1 of 1
APPLICATION NO. : 11/340964
DATED : October 20, 2009
INVENTOR(S) : Masuichi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 697 days.

Signed and Sealed this

Fifth Day of October, 2010

David J. Kappos
*Director of the United States Patent and Trademark Office*